United States Patent [19]
Finnila et al.

[11] 4,197,553
[45] * Apr. 8, 1980

[54] MONOLITHIC EXTRINSIC SILICON INFRARED DETECTOR STRUCTURE EMPLOYING MULTI-EPITAXIAL LAYERS

[75] Inventors: Ronald M. Finnila, Carlsbad; Stephen C. Su, Huntington Beach, both of Calif.

[73] Assignee: Hughes Aircraft Company, Culver City, Calif.

[*] Notice: The portion of the term of this patent subsequent to Feb. 27, 1996, has been disclaimed.

[21] Appl. No.: 720,865

[22] Filed: Sep. 7, 1976

[51] Int. Cl.² .................... H01L 27/14; H01L 31/00
[52] U.S. Cl. .................... 357/30; 250/211 J; 250/338; 250/340; 307/304; 307/311; 357/24
[58] Field of Search .................... 357/24, 30; 307/304, 307/311; 250/211 J, 332, 334, 338, 340

[56] References Cited

U.S. PATENT DOCUMENTS

| | | | |
|---|---|---|---|
| 3,660,697 | 5/1972 | Berglund et al. | 357/24 |
| 3,771,149 | 11/1973 | Collins et al. | 357/24 |
| 3,808,435 | 4/1974 | Bate et al. | 357/24 |
| 3,845,295 | 10/1974 | Williams et al. | 357/24 |
| 3,849,651 | 11/1974 | Ennulat | 357/24 |
| 3,883,437 | 5/1975 | Nummedal et al. | 357/24 |
| 3,896,474 | 7/1975 | Amelio et al. | 357/24 |
| 3,896,485 | 7/1975 | Early | 357/24 |
| 3,902,066 | 8/1975 | Roosild et al. | 357/24 |

FOREIGN PATENT DOCUMENTS

2439799  3/1975  Fed. Rep. of Germany ............ 357/24

OTHER PUBLICATIONS

Nelson, "Accumulation-Mode Charge-Coupled Device", Applied Physics Letters, vol. 10 (11/74), pp. 568-570.

Primary Examiner—S. C. Buczinski
Attorney, Agent, or Firm—G. Tacticos; W. H. MacAllister

[57] ABSTRACT

There is disclosed an all silicon monolithic focal plane array of infrared detectors for image detection. The structure comprises two epitaxial layers grown on an extrinsically doped silicon substrate. The detectors are formed in and extend through the substrate, the material of which is sensitive to specific wavelength infrared signals according to the dopant used in the substrate. The collection of charges takes place on a first buried layer formed around a portion of the first epitaxial layer-substrate interface, and the charges are then transferred through a second buried layer of the same conductivity type to a conducting surface layer on the upper portion of the second epitaxial layer. The signal readout function is performed by a charge coupled device shift register constructed in the second epitaxial layer by providing selectively spaced electrodes in an insulating layer. Carriers generated in the detector by incident infrared radiation are collected into the first buried layer and then pass through the second buried layer to the surface layer and they are injected therefrom into the CCD shift register and are detected at the output. The monolithic construction and the use of an epitaxial layer to form the CCD shift register result in high yield and high efficiency devices. The use of two epitaxial layers in the device improves its responsivity, its fill factor and better isolates the operation of its CCD circuits from its detector elements.

15 Claims, 3 Drawing Figures

MONOLITHIC EXTRINSIC SILICON INFRARED DETECTOR STRUCTURE EMPLOYING MULTI-EPITAXIAL LAYERS

FIELD OF THE INVENTION

This invention relates generally to detectors and more particularly to a monolithic extrinsic silicon infrared detector containing a CCD structure to perform the signal readout functions of the device. The detector has two epitaxial layers and a CCD structure constructed on a portion of the second epitaxial layer.

RELATED APPLICATIONS

The device disclosed herein may include, but does not require, circuitry for removing the DC component or background representing charge of the type disclosed in our copending U.S. patent application Ser. No. 601,124, filed July 31, 1975, now U.S. Pat. No. 3,969,634, and entitled "Bucket Background Subtraction Circuit for Charge Coupled Devices," which is assigned to the present assignee. The bucket background subtraction circuit is hereinafter referred to as "BBS."

In another copending U.S. patent application, Ser. No. 614,277, filed Sept. 17, 1975, and entitled "Monolithic Extrinsic Silicon Infrared Detectors with Charge Coupled Device Readout," and assigned to the present assignee, there is disclosed and generically claimed a broad new class of IR detectors and related fabrication processes wherein, among other things, the IR detector and associated CCD circuitry for the signal readout function are combined in a novel manner to produce a monolithic extrinsic silicon detector structure.

In another copending application, Ser. No. 702,548, filed July 6, 1976, now U.S. Pat. No. 4,142,198, and entitled "Monolithic Extrinsic Silicon Infrared Detectors with an Improved Charge Collection Structure," and assigned to the present assignee, there is disclosed and generically claimed another new class of IR detectors and related fabrication processes, wherein among other things, new collection structures are used to collect and transfer the charges produced in the detector elements.

BACKGROUND OF THE INVENTION AND PRIOR ART

The present invention relates generally to imagers having a focal plane array of infrared detectors and charge coupled device signal processing circuitry associated with the detectors to transfer the signals produced by the detectors into data processing apparatus. Here the image may be reconstructed from the signals in a manner determined by the particular mode of scanning employed. Imagers of this general type are disclosed, for example, in the following U.S. Pat. Nos.:

B. K. Weimer—3,683,193
Y. Takamura—3,777,061
D. R. Collins—3,771,149
K. Nummedal—3,883,437.

In the prior art, of which the foregoing patents are typical, efforts to integrate the photodetectors of such an array with charge coupled circuitry have in the past led either to hybrid devices wherein the detectors were mounted on top of a separate semiconductor substrate in which the charge coupled circuitry was contained or to an arrangement wherein the photodetectors were formed as portions of the same semiconductor substrate containing the charge coupled circuitry.

The device disclosed and claimed in our copending application Ser. No. 614,277 represents a successful monolithic integration of the detector and its associated CCD circuitry into one efficient and low-cost device. In the fabrication of our earlier structure disclosed in Ser. No. 614,277, an epitaxial layer is formed on an IR detector substrate and then a portion of that epitaxial layer is etched away as to permit infrared radiation to impinge on the individual detectors of the substrate. This construction produces charges which are then read out by direct injection into the charge coupled device which is built on the epitaxial layer and functions to transfer charges through the epitaxial layer and into the output of the device.

The device disclosed and claimed in our copending application Ser. No. 702,548 eliminates the need for having a portion of the epitaxial layer etched away. It instead uses different means for collecting charges generated in the detector elements and injecting them into the CCD circuitry. Among the charge collection structures disclosed was the use of a conducting buried layer and conducting surface layer combination for the collection and transfer of charges from the detector elements to the CCD circuitry.

We believe that our inventions disclosed and claimed in the aforementioned patent applications represents truly significant advances in this art as explained in detail in said applications. Our present invention extends the developments in this area of technology and has the further advantages of improving the fill factor with either frontside or backside imaging, maintaining a uniform electric field distribution in the detector region and improving the isolation of the CCD operation from the extrinsically doped substrate.

SUMMARY OF THE INVENTION

The general purpose of this invention is to provide a new and improved image detector, having most if not all of the advantages and features of similarly employed devices, while eliminating many of the aforementioned disadvantages of prior art structures.

To accomplish this purpose, we have provided a novel structure including an image detector operable to generate electrical charge signals in response to optical radiation impinging from either frontside or backside, and having means for processing said signals comprising a charge coupled signal collecting device for transferring charge to a utilization circuit.

This structure comprises a semiconductor substrate of a first conductivity type having a first and second epitaxial layer adjacent to said semiconductor substrate and having a second type of conductivity. The substrate includes an optical detector region formed in at least a portion of the semiconductor substrate for generating charge in response to received radiation. In the vicinity of a portion of the interface between the first and second epitaxial layers there is a conducting layer having a second type conductivity and a higher conductivity than that of the adjacent epitaxial layers. The structure further includes conducting means of the same conductivity type as the detector region, for permitting charge generated in the detector region in response to received radiation to move from this region and through the first and second epitaxial layers to the upper surface of the second epitaxial layer. On the second epitaxial layer there is an insulating layer of dielectric material and a plurality of electrode means that are spaced from the second epitaxial layer by at least a portion of the insulating layer. These electrode means form in part a charge coupled structure for processing charge generated in the optical detector region and for moving it along the second epitaxial layer to a utilization circuit.

In a preferred embodiment of this invention, as briefly summarized above, the means for the transfer of charges from the optical detector region to the second epitaxial layer may include in combination a first heavily doped buried layer of a first conductivity type disposed adjacent a portion of the interface between the semiconductor substrate and the first epitaxial layer, a second heavily doped buried layer of a first type of conductivity formed in predetermined portions of the first and second epitaxial layers and adjacent a portion of the first heavily doped buried layer, and a heavily doped surface layer of a first type of conductivity formed in a portion of said second epitaxial layer adjacent to the second buried layer. The device is operative to transfer signal charges from the detector element through the first and second buried layers and the surface layer and through the second epitaxial layer to the utilization circuit. Such transfer is made typically in response to a cyclical voltage applied to the electrode means to control the potential profile in the epitaxial layers.

The aforementioned two epitaxial layers and the conducting layer between a portion of the two, spatially disposed under the CCD electrodes, make possible to operate the device with the CCD circuitry having for all practical purposes no interference with the operation of the detector region in the substrate. The first buried layer at the first epitaxial layer-substrate interface is used as a charge collector for the detector. The charges are then transferred, under the influence of an electric field through the second buried layer and the surface buried layer and are injected into the CCD circuitry. The electric field is normally established by the appropriate biasing of a transfer gate electrode in the insulating layer, and a detector electrode formed in the backside of the substrate. The purpose of the second buried layer is to electrically connect the first buried layer to the surface layer. The second buried layer can be eliminated if the surface layer can be made deep enough to reach the first buried layer. This depends on the thickness of the two epitaxial layers.

By having a first buried layer covering the optical detector region, most of the substrate can be used to detect the radiation impinging on the substrate from either the frontside or the backside of the detector. So the fill factor of the detector can be optimized to nearly 100% of the device's area. Furthermore the signal-to-noise ratio at the output end of the CCD shift register is improved by the use of a conducting layer between a portion of the epitaxial layers, because it shields the detector region from the CCD.

Because the fill factor of the device is very close to 100% which requires large first buried layers, there is sometimes a need to isolate the first buried layers of adjacent devices. This can be accomplished by forming a conducting buried layer of opposite type conductivity to that of the first buried layer, in a predetermined portion of the first epitaxial layer-substrate interface, spatially disposed between first buried layers of adjacent devices.

Accordingly, it is an object of the present invention to provide a new and improved monolithic extrinsic silicon optical detector with an improved charge collection scheme.

A feature of this invention is the provision of a monolithic extrinsic silicon IR detector with two epitaxial layers, a charge coupled device operative to perform the signal readout function, two buried conducting layers and a surface conducting layer operative to transfer the charges from the detector element in the substrate to the charge coupled device in the second epitaxial layer adjacent a first epitaxial layer which in turn is adjacent the substrate and a shielding buried layer between portions of the two epitaxial layers.

A feature of this invention is the provision of a monolithic extrinsic silicon IR detector with a semiconductor substrate of a first conductivity type, first and second adjacent epitaxial layers of a second conductivity type, a CCD in a portion of the second epitaxial layer, a heavily doped buried layer of a second conductivity type between the two epitaxial layers in a portion under the CCD, a first heavily doped buried layer of a first conductivity type over a substantial portion of the substrate, a heavily doped surface layer of a first conductivity type, a second heavily doped buried layer between the surface layer and the first buried layer, a heavily doped channel stop layer of a second conductivity type in the second epitaxial layer at the end of the CCD channel and a heavily doped isolation region of a second conductivity type formed in a portion of the interface between the substrate and the first epitaxial layer to isolate the first buried layers of successive devices.

These and other objects and features of the invention will become apparent in the following description taken in conjunction with the accompanying drawings.

DETAILED DESCRIPTION OF DRAWINGS

Figure 1:
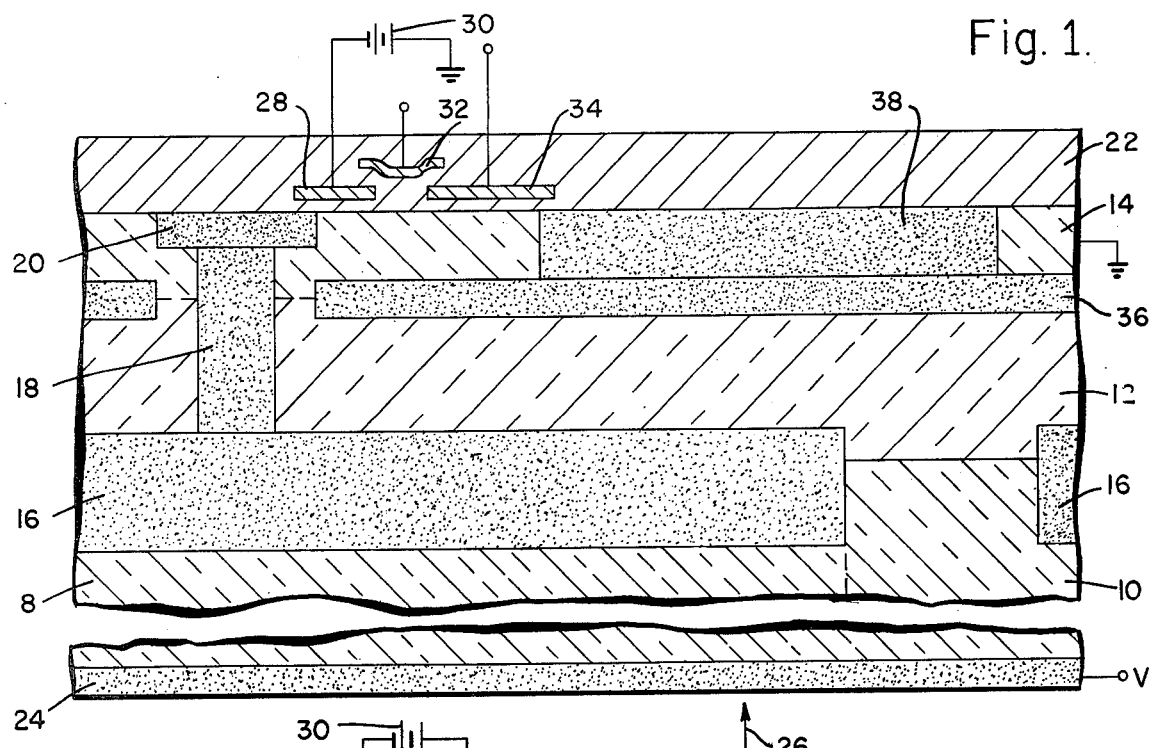
FIG. 1 is a diagrammatic cross-sectional view of an image detector device embodying the present invention. It includes first and second buried layers and a surface layer to transfer the charges from the detector element to the CCD circuitry. It also has a shield region between two epitaxial layers and a channel stop layer.

Referring now to FIG. 1, there is shown a cross-sectional view of an infrared detector constructed in accordance with the present invention. Each detector element 8 is formed in a semiconductor substrate 10 and extends through it. In an exemplary device the substrate 10 was extrinsic silicon doped with gallium atoms to a concentration of approximately $3 \times 10^{16}$ atoms per $cm^3$. Other P-type dopants such as indium may also be used to produce a P-type substrate. Formed on the substrate 10 is a first epitaxial layer 12 and a second epitaxial layer 14 of N-type silicon and infrared radiation can pass through both layers to reach the detector element. The second epitaxial layer 14 is used for the CCD circuitry. The CCD may be a two-phase structure with overlapping polycrystalline silicon gate electrodes. On a portion of the first epitaxial layer-substrate interface and in the vicinity of the detector element, there is a first P+ buried layer 16. This layer is usually formed prior to the deposition of the first epitaxial layer and it may be made by doping a portion of the substrate, over the detector element with a P-type impurity, such as, for example, boron. The P+ layer should be degenerately doped with a typical concentration of over $5 \times 10^{18}$ atoms/cm$^3$ such that carriers will not freeze-out completely at the device operating temperature (10°–20° k.), and yet it should not be so heavily doped as to hinder the later epitaxial deposition operation. This P+ buried layer will out-diffuse into the epitaxial layer during subsequent processing steps. A second degenerately doped P+ layer 18 is formed on a portion of the interface between the first and second epitaxial layers in a way as to be electrically connected to the first P+ buried layer. This layer may also be formed by the degenerately doping of a portion of the first epitaxial layer with a P-type impurity such as, for example boron, prior to the deposition of the second epitaxial layer. A P+ surface layer 20 is formed in a way as to be electrically connected to the P+ buried layer 18 at zero bias voltage. The surface layer serves as the input diffusion to a CCD shift register located in the second epitaxial layer. Under low temperature (4° k.–20° k.) the carriers in the gallium doped substrate are frozen out in the dopant level. Hence, incoming infrared signals from either the frontside or backside of the detector, with wavelengths such that the incident energy is equal to or greater than the ionization energy of the dopant level will generate carriers in the detector region. These generated carries are collected by the P+ first buried layer, they pass through the second P+ buried layer and are injected through the P+ surface layer into the CCD shift register formed in the second epitaxial layer and are detected at the output end thereof. Such devices are of particular interest in the infrared wavelength ranges of 3–5 micrometers and 8–14 micrometers for aircraft or missile tracking systems and the like.

Above the second epitaxial layer 14 there is a layer 22 of insulating material. A diffused layer 24 is formed on the back side of the substrate 10. Layer 24 is also referred to as a detector electrode, and is connected to a source of positive voltage V. The second epitaxial layer 14 is normally connected to a ground 28.

A plurality of electrodes are disposed in the insulating layer 22 and the fields generated by the drive voltages applied to these electrodes cooperate with the second epitaxial layer 14 to define the functioning of the charge coupled device readout circuitry.

Infrared radiation 26 enters through the detector electrode 24 to strike the photodetector element 8 and thereby generate a charge in detector 8. The charge, holes in this case, will be collected by the P+ buried layer 16 and injected through the second P+ buried layer 18 and the P+ surface layer 20 into the readout circuitry. Adjacent the surface element 20 is a bias electrode 28 to which negative bias from battery 30 is applied. Next to the bias electrode 28 there is a transfer gate electrode 32 and next to it an input electrode 34 of a CCD shift register. The bias electrode, transfer gate electrode and the CCD electrodes are all made through conventional techniques using polycrystalline silicon or appropriate metals such as aluminum. In the exemplary device, polycrystalline silicon was used to make these electrodes. Alternatively, polycrystalline silicon may be used to make the set of electrodes that are relatively close to the epitaxial layer and aluminum for the set of electrodes further from the epitaxial layer.

A conducting buried layer should be used to shield the CCD operation from the substrate. For the P-channel CCD of our exemplary device, this shield layer 36 is N+ and is located at the portion of the first epitaxial layer-second epitaxial layer interface directly under the CCD. This N+ buried layer enables the room temperature testing of CCD devices even on a thin (i.e. 3–4 μm) epitaxial layer. From the CCD register 34 the charge goes into an MOS output/reset circuit. The device also has an N+ channel stop diffusion 38.

There is usually a linear array of photodetector elements and they are either used with an optical scanner or they are moved in any convenient manner relative to the scene to be imaged. From each of the photodetector elements 8 a charge transfer path leads orthogonally away from the row of photodetectors to the charge coupled device shift register 34 at the rear of the device which extends in a direction parallel to the row of photodetectors for final readout. Charge is read onto the CCD shift register in parallel and is read out in series.

The details of circuit configuration and mode of operation of the signal readout function, including the operation of the bias electrode, transfer gate and the CCD shift register, have been more fully set forth and explained in our copending application Ser. No. 614,277, filed Sept. 17, 1975. The device claimed in the above-referenced application uses, like the present invention, a CCD circuit for the processing of the readout signal.

Figure 2:
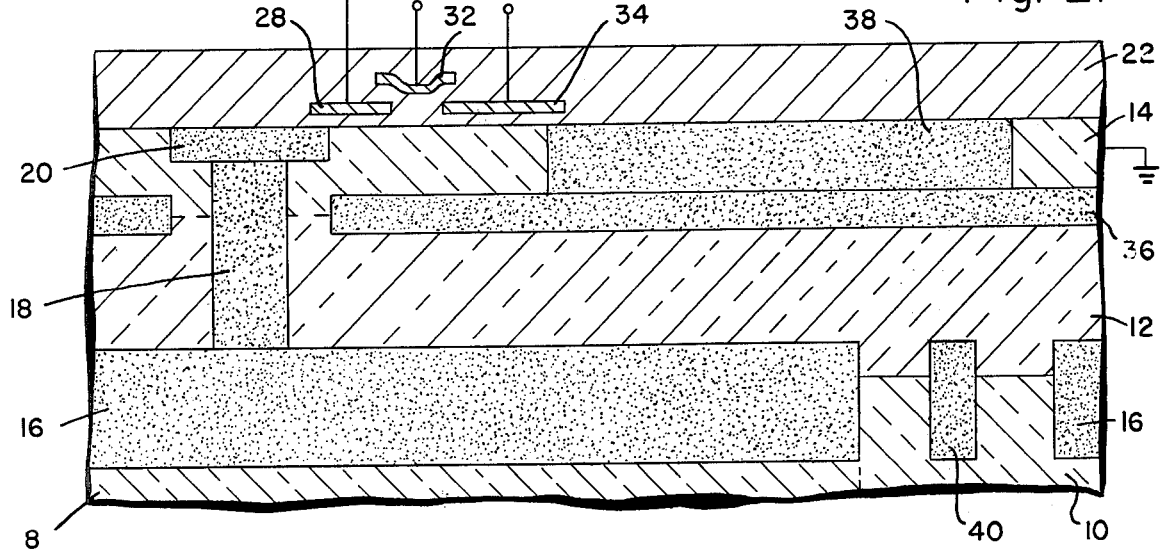
FIG. 2 is a diagrammatic cross-sectional view of a portion of the detector depicted in FIG. 1, which further includes an isolation buried layer for successive devices.

Referring now to FIG. 2, there is shown an IR detector similar to the one shown in FIG. 1 with the addition of an isolation buried layer 40 in the vicinity of a predetermined portion of the interface between the substrate and the first epitaxial layer. It is an N+ region for a P-type detector. This N+ region is made through the heavy doping of a predetermined portion of the substrate with an N-type impurity such as phosphorous. The purpose of this layer is to insure isolation between adjacent P+ buried layers and help prevent autodoping between the P+ layers during the first epitaxial layer deposition. The need for such an N+ buried layer can be avoided by having the P+ buried layers apart by, for example, 1 mil or so. However, having the buried layer apart means smaller buried layers and therefore a smaller area for the collection of charges and therefore smaller sensitivity to incoming radiation.

Figure 3:
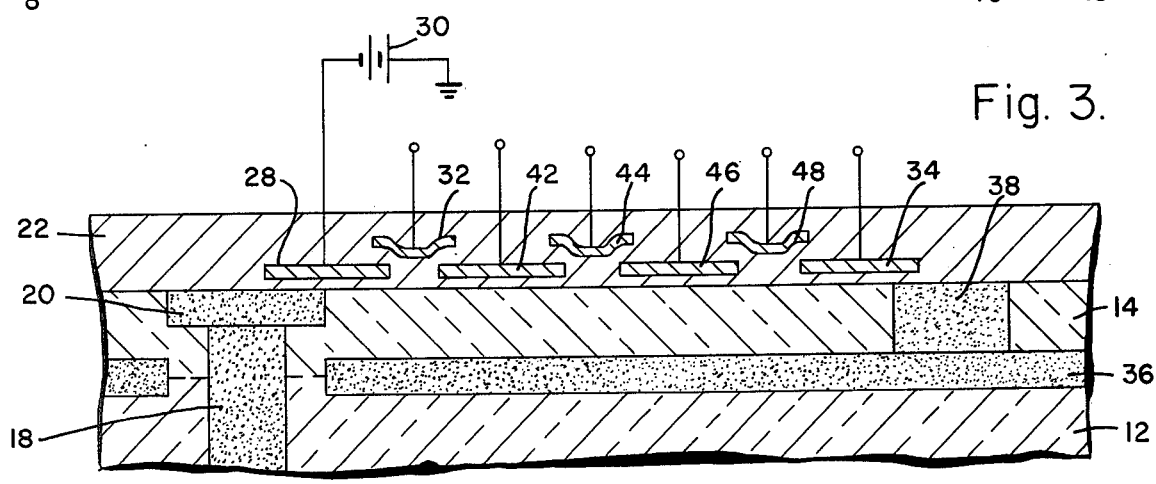
FIG. 3 is a diagrammatic cross-sectional view of a portion of the detector depicted in FIG. 1, which further includes a bucket background subtraction circuitry (BBS).

Referring now to FIG. 3, there is shown an IR detector similar to the one shown in FIG. 1 with the addition of a bucket background subtraction circuit (BBS). A more detailed description of the configuration and mode of operation of a bucket background subtraction circuit can be found in our copending application Ser. No. 601,124, filed July 31, 1975, and entitled "Bucket Background Subtraction Circuit for Charge Coupled Devices." From reference to that application it will be seen that the purpose of this portion of the circuitry which may optionally be used in this or other similar imaging devices is to reduce the background or DC component level of the charge signal being supplied to the shift register 34 in order to reduce the charge handling requirements imposed on the shift register. With the detector electrode 24 at an appropriate positive voltage and the bias electrode 28 at an appropriate negative voltage the detector element 8 is biased to act as a photodetector. The holes generated in the P-type detector element 8, by the incidence of infrared radiation 26 and initially collected in the first buried layer 16 will be transferred through the second buried layer 18 and then through the surface layer 20 and then under the influence of the bias electrode 28 and the transfer gate 32 will fill the background charge storage potential well under electrode 42. The signal charge then overflows the BBS storage potential barrier which is controlled by the control gate 44 and flows into the signal storage section under electrode 46. The second transfer gate 48 will then clock the charge into the CCD shift register where it is shifted to the output end as described above in connection with FIG. 1. The addition of the BBS circuitry is this basic device affords protection against charge overload in a high IR background environment in a manner more fully explained in our above-referenced copending application (Ser. No. 601,124), but is not otherwise necessary to the operation of the basic device.

For devices constructed in accordance with this invention radiation may penetrate the device from either the front or the back side.

The N+ and P+ regions are regions that are so heavily doped with appropriate impurities as to be degenerate or essentially metallic. When a phrase such as a degenerate region, or a heavily doped region is used in this specification to describe a semiconductor region, it refers to a region that has a doping density high enough to move the Fermi level of the material into the conduction or valance band.

Using this invention, both P-type and N-type image detectors can be constructed. Although most discussion in this specification focuses around the P-type detector having a P-type substrate, two N-type epitaxial layers, a first P+ buried layer, a second P+ buried layer, a P+ surface layer, a P-channel CCD, an N+ shield layer between a section of the two epitaxial layers, the same principles equally apply to an N-type detector with an N-type substrate, two P-type epitaxial layers, first and second N+ buried layers, an N+ surface layer, an N-channel CCD and a P+ shield layer and a P+ buried layer to isolate first N+ buried layers of successive devices. For an N-type infrared detector arsenic may be used as a substrate dopant. The selection of the dopant for the substrate depends on the ultimate use of the detector. For example, indium or gallium may be used for the infrared range of 3–5 micrometers. Gallium may also be used for the infrared range of 8–14 micrometers. Arsenic may be used for applications in the range above 14 micrometers. Other dopants can be used for the different ranges of the optical spectrum.

Although most of the discussion in this specification focuses on embodiments of the invention made for the detection of infrared radiation, the invention is not limited to infrared detectors but to optical detectors in general. The selection of the substrate dopant determines the ultimate wavelength sensitivity of the detector.

What is claimed is:

1. An image detector including in combination:
    (a) a semiconductor substrate of a first conductivity type having at least one optical detector region for generating charge in response to received radiation;
    (b) a first epitaxial layer adjacent to said semiconductor substrate and having a second type conductivity;
    (c) a second epitaxial layer adjacent to said first epitaxial layer and having a second type conductivity;
    (d) a conducting layer in the vicinity of a portion of the interface between said first and said second epitaxial layers and having a second type conductivity wherein said conducting layer has a conductivity which is higher than that of the adjacent epitaxial layers;
    (e) conducting means of the same conductivity type as said detector region for permitting charge generated in said detector region in response to received radiation to move from said region and through said first and second epitaxial layers to the upper surface of said second epitaxial layer;
    (f) an insulating layer of dielectric material formed on the exposed surface of said second epitaxial layer;
    (g) a plurality of electrode means spaced from said second epitaxial layer by at least a portion of said insulating layer forming in part a charge coupled structure for processing charge generated in said optical detector region and moving it along said second epitaxial layer to a utilization circuit.

2. An image detector as set forth in claim 1 wherein said means for the transfer of charge from said predetermined portion of said semiconductor substrate to said second epitaxial layer comprise:
    (a) a first buried layer of a first type of conductivity and having a higher impurity concentration than said semiconductor substrate and said epitaxial layers, disposed adjacent a portion of the semiconductor substrate-first epitaxial layer interface;
    (b) a surface layer of a first type of conductivity and having a higher impurity concentration than said semiconductor substrate and said epitaxial layers, formed in predetermined portions of said first and said second epitaxial layers extending between a predetermined portion of said first buried layer and a predetermined portion of said insulating layer.

3. An image detector as set forth in claim 1 wherein said means for the transfer of charge from said semiconductor substrate to said second epitaxial layer comprise:
    (a) a first buried layer of a first type of conductivity and having a higher impurity concentration than said semiconductor substrate and said epitaxial layers, disposed adjacent a portion of the semiconductor substrate-first epitaxial layer interface;
    (b) a second buried layer of a first type of conductivity formed in predetermined portions of said first and said second epitaxial layers adjacent a portion of said first buried layer;
    (c) a surface layer of a first type of conductivity and having a higher impurity concentration than said semiconductor substrate and said epitaxial layer, formed in predetermined portions of said first and said second epitaxial layer extending between a predetermined portion of said first buried layer and a predetermined portion of said insulating layer.

4. An image detector as set forth in claim 2 wherein said semiconductor substrate contains a detector electrode formed through the doping of a substrate surface opposite to that on which said epitaxial layers are formed, by a conductivity determining impurity of a first type of conductivity wherein the conductivity of said detector electrode is relatively high in comparison to that of the remaining portion of said substrate.

5. An image detector as set forth in claim 4 which further includes a channel stop region formed through the doping of a predetermined portion of said second epitaxial layer with a conductivity determining impurity of a second type wherein the conductivity of said channel stop region is relatively high in comparison with that of the remaining portion of said second epitaxial layer.

6. In an image detector of the type having at least one optical detector operable to generate electrical charge signals in response to optical radiation, and having means for processing said signals comprising a charge coupled signal collecting device for transferring charge to a utilization circuit, the improvement comprising:
   (a) a semiconductor substrate of a first conductivity type having first and second adjacent epitaxial layers of a second conductivity type monolithically formed thereon;
   (b) at least one optical detector element formed in said substrate and having at least one surface accessible to optical radiation;
   (c) a conducting layer of a second conductivity type in the vicinity of a predetermined portion of the interface between said first epitaxial layer and said second epitaxial layer, wherein said conducting layer has a conductivity that is relatively higher than that of the adjacent epitaxial layers and whereby said conducting layer shields said substrate from said charge coupled device;
   (d) a series of degeneratively doped layers of a first conductivity type in predetermined regions of said first and said second epitaxial layers and said substrate for permitting charge generated in said substrate in response to received radiation to move from said substrate through said series of degeneratively doped layers to the upper surface of said second epitaxial layer and said charge coupled device;
   (e) an insulating layer of dielectric material formed on said second epitaxial layer;
   (f) a plurality of electrode means spaced from said second epitaxial layer by at least a portion of said insulating layer for forming said charge coupled signal processing device in said insulating and second epitaxial layers to transfer signal charges from said detector element through said collection and transfer means and through said second epitaxial layer to said utilization circuit in response to cyclical voltage applied to said electrode means to control the potential profile in said second epitaxial layer.

7. A device as set forth in claim 6 wherein said substrate contains a detector electrode formed through the relatively heavy doping of a substrate surface opposite to that on which said epitaxial layers are formed, by a conductivity determining impurity of a first type of conductivity whereby each of said detector elements extends from said detector electrode through said substrate to said means for the collection and transfer of charge.

8. A device as set forth in claim 7 wherein said means for the collection and transfer of charge from said substrate to said second epitaxial layer comprise:
   (a) a first buried layer, heavily doped with a conductivity determining impurity of a first type, spatially disposed in the vicinity of a predetermined portion of the substrate-first epitaxial layer interface;
   (b) a surface layer, heavily doped with a conductivity determining impurity of a first type formed in predetermined portions of said first and said second epitaxial layers and extending between a predetermined portion of said first buried layer and a predetermined portion of said insulating layer.

9. A device as set forth in claim 8 wherein said detector electrode is connected to a source of voltage, appropriate for its conductivity type, and said second epitaxial layer is connected to ground.

10. A device as set forth in claim 8 wherein each of said detectors has operatively associated with it a charge coupled signal collecting device which extends in said second epitaxial layer in a direction orthogonal to a line scanner.

11. A device as set forth in claim 10 wherein all of said charge coupled signal collecting devices feed charge signals in parallel into a common serially operated charge coupled shift register.

12. A device as set forth in claim 10 wherein each of said signal collecting devices includes background subtraction circuit means for removing a uniform image background representing D.C. component from said charge signal transmitted through it.

13. A device as set forth in claim 10 which further includes a surface channel stop layer formed in a predetermined section of said second epitaxial layer by heavy doping with a conductivity determining impurity of a second type.

14. A device as set forth in claim 10 which further includes a second buried layer heavily doped with a conductivity determining impurity of a second type, formed in the vicinity of a predetermined portion of said substrate first epitaxial layer interface whereby said second buried layer improves the isolation of said first buried layers of adjoining devices in an array of devices.

15. An image detector of the type having a semiconductor substrate of a first conductivity type operable to generate electrical charge signals in response to optical radiation and a CCD shift register for the processing of said charge signals, the improvement comprising:
   (a) a first epitaxial layer of a second conductivity type adjacent a surface of said substrate;
   (b) a second epitaxial layer of a second conductivity type adjacent said first epitaxial layer;
   (c) an insulating layer adjacent said second epitaxial layer and containing electrode means for said CCD;
   (d) a degenerately doped buried layer of a second conductivity type spatially disposed below said CCD in a predetermined portion of the interface between said first and said second epitaxial layers for shielding said substrate from said CCD;
   (e) conducting means adjacent said substrate for the collection and transfer of charge from said substrate to said CCD whereby the use of said two epitaxial layers to separate the CCD structure from said substrate and the use of said buried layer between portions of said epitaxial layers improves the detector's fill factor for either frontside or backside imaging, improves the uniformity of the electric field distribution in said substrate region and improves the signal-to-noise ratio at the output end of said CCD shift register.

* * * * *